United States Patent [19]
Russick et al.

[11] Patent Number: 6,110,982
[45] Date of Patent: Aug. 29, 2000

[54] EPOXY FOAMS USING MULTIPLE RESINS AND CURING AGENTS

[75] Inventors: Edward M. Russick, Rio Rancho; Peter B. Rand, Albuquerque, both of N. Mex.

[73] Assignee: Sandia Corporation, Albuquerque, N. Mex.

[21] Appl. No.: 09/229,512

[22] Filed: Jan. 13, 1999

[51] Int. Cl.7 ........................................ C08J 9/00
[52] U.S. Cl. .................. 521/54; 521/91; 521/93; 521/94; 521/95; 521/97; 521/99; 135/178
[58] Field of Search .................... 521/178, 135, 521/89, 91, 93, 94, 95, 97, 99, 54

[56] References Cited

U.S. PATENT DOCUMENTS

| | | | |
|---|---|---|---|
| 2,959,508 | 11/1960 | Graham et al. | 521/135 |
| 3,316,187 | 4/1967 | Grosner et al. | 521/135 |
| 3,615,972 | 10/1971 | Morehouse, Jr. | 521/135 |
| 3,629,163 | 12/1971 | Nolken | 521/135 |
| 4,090,986 | 5/1978 | Gormley et al. | 260/2.5 |
| 4,798,848 | 1/1989 | Dietheim | 521/135 |
| 4,923,902 | 5/1990 | Wycech | 521/135 |
| 5,274,006 | 12/1993 | Kagoshima et al. | 521/135 |
| 5,457,165 | 10/1995 | Hermansen et al. | 525/420.5 |

OTHER PUBLICATIONS

Russick, E. M., and Rand, P.B., "Development and Characterization of a New Epoxy Foam Encapsulant as an Ablefoam Replacement," Sandia National Laboratories Report SAND98–2538, Albuquerque, New Mexico, 1998.

*Primary Examiner*—Morton Foelak
*Attorney, Agent, or Firm*—Elmer A. Klavetter

[57] ABSTRACT

An epoxy foam comprising a plurality of resins, a plurality of curing agents, at least one blowing agent, at least one surfactant and optionally at least one filler and the process for making. Preferred is an epoxy foam comprising two resins of different reactivities, two curing agents, a blowing agent, a surfactant, and a filler. According to the present invention, an epoxy foam is prepared with tailorable reactivity, exotherm, and pore size by a process of admixing a plurality of resins with a plurality of curing agents, a surfactant and blowing agent, whereby a foamable mixture is formed and heating said foamable mixture at a temperature greater than the boiling temperature of the blowing agent whereby said mixture is foamed and cured.

17 Claims, No Drawings

EPOXY FOAMS USING MULTIPLE RESINS AND CURING AGENTS

This invention was made with Government support under Contract No. DE-AC04-94AL85000 awarded by the Department of Energy. The Government has certain rights in the invention.

BACKGROUND OF THE INVENTION

The invention relates to an epoxy foam and a process for making the same. More particularly, this invention relates to a tailorable epoxy foam encapsulant formed using at least two resins and at least two curing agents.

In the fabrication of electronic devices and circuits, the electronic devices are protected from the adverse effects of the environment by filling the empty spaces between components on the device with a potting material that encapsulates these components. If the electronic device is used outdoors, such as in automotive, aircraft, marine, or building applications, the potting or encapsulant material must be stable enough to provide protection over extreme outdoor temperatures and humidity conditions, as well as mechanical stresses. Additionally, the encapsulant material can serve to isolate the protected devices from human intrusion. In some applications, future access to the device is desired and so the encapsulant must be capable of isolating the device for a period of time but must have mechanical and structural characteristics to allow subsequent removal of the encapsulant. Consequently, such encapsulants must possess suitable thermal, mechanical and electrical properties.

Epoxy compounds have been widely used as adhesives, encapsulants and coatings for a variety of applications. Epoxy compounds typically have good insulating properties and excellent adhesion, and are easy to process. However, flexibilized epoxies usually have poor thermal stability, hydrolytic stability and mechanical properties; and consequently, have not been used for elastomeric applications. Rather, polyurethane or silicone potting compositions have been used for these applications. However, polyurethanes are more difficult to process due to their tendency to foam when in contact with moisture-containing surfaces. Silicones have the disadvantage of being poor adhesives and are also mechanically weak and costly.

Epoxy foam encapsulants have a general composition that includes a resin, a curing agent, a surfactant, a blowing agent and a filler or nucleating agent. The resin, curing agent and surfactant, as well as the curing conditions, are chosen to yield a specific foam encapsulant structure. The mixture is cast into a mold and heated to form and cure the encapsulant.

Gormley et al. (U.S. Pat. No. 4,090,986, issued on May 23, 1978) describe an epoxy foam composition which uses a delta-1-tetrahydrophthalic anhydride epoxy resin with an amine curing agent to form a thermoset epoxy foam. Hermansen et al. (U.S. Pat. No. 5,457,165, issued on Oct. 10, 1995) note that there are various resins which may be used in forming an encapsulant; diglycidyl ethers are commonly used. Hermansen et al. also describe an encapsulant which uses two resins to tailor the property of the formed encapsulant to provide both dry heat and humid heat stability. The invention according to Hermansen et al. differs from other formed encapsulants in that the invention utilizes more than one resin to tailor specific properties of the encapsulant to achieve desired properties. Russick and Rand (Sandia National Laboratories Technical Report SAND98-2538, Albuquerque, N. Mex., December, 1998, incorporated by reference herein) describes a new epoxy foam encapsulant that utilizes multiple resins and curing agents to control the reactivity, exotherm, and pore size and therefore the mechanical, thermal, and electrical properties of the formed epoxy foam encapsulant. Such control allows for epoxy foams of larger volumes without excessive reactivity and exotherm which could lead to lowered pot life, premature curing prior to filling void volume, or burn out of the foam.

Useful would be a foam encapsulant without carcinogenic constituents that has tailorable mechanical, thermal, and electrical properties that allow encapsulation of a component such as electromechanical components or instrumentation that sufficiently isolates the material from the outside environment with adequate thermal/mechanical properties to allow removal so that the encapsulated component can be accessed.

SUMMARY OF THE INVENTION

According to the present invention, an epoxy foam is provided, comprising a plurality of resins, a plurality of curing agents, at least one blowing agent, at least one surfactant; and optionally at least one filler. Preferred is an epoxy foam comprising two resins of different reactivities, two curing agents, a blowing agent, a surfactant, and a filler. More preferred is an epoxy foam wherein the two resins are Epon 830 and Epon 8121.

Also according to the present invention is a process of making an epoxy foam with tailorable properties, comprising admixing a plurality of resins with a plurality of curing agents, a surfactant and blowing agent, whereby a foamable mixture is formed and heating said foamable mixture at a temperature greater than the boiling temperature of the blowing agent whereby said mixture is foamed and cured.

The epoxy foam according to the present invention can be employed in a kit, wherein the kit comprises a premixed component consisting essentially of the curing agents, a premixed component consisting essentially of the epoxy resins, the surfactant and the nucleating agent, and a component consisting essentially of the blowing agent.

DESCRIPTION OF SPECIFIC EMBODIMENTS

Epoxy foams are formed by cross-linking reactions between epoxy resins and curing agents that create a three-dimensional covalent bond network. There are numerous commercially available epoxy resins and curing agents that are used to achieve epoxy foams with different thermal, mechanical, and electrical properties. A type of epoxy resin that is commonly used is diglycidyl ether of bisphenol A (DGEBPA). Examples of these are: the solid Epon 1001, Epon 1002, Epon 1004, Epon 1007 and Epon 1009; and the liquid, Epon 826, Epon 828 and Epon 830, manufactured by Shell Chemical Corp. Also, the following epoxy resins may be used: the solid ERL-2002, 2003 and 3001 and the liquid ERL 2772, 2774 and 3794 manufactured by Bakelite Co. of the Union Carbide Plastics Division. Any epoxy resin that is comparable to the above listed epoxy resins may be used regardless of the manufacturer.

The addition of a curing agent to the epoxy resin causes the liquid resin to cure or harden into a rigid cross-linked polymer. When the resin is intimately mixed with a stoichiometric amount of a curing agent containing labile hydrogen atoms, the epoxy ring opens and reacts with the curative. Most cured epoxy foams are produced using one of three types of curing agents, which are amines, polyphenols, and anhydrides. Cure is achieved by polyaddition with no by-product formation, and the cure reaction between epoxy resins and curatives is exothermic which, in some cases, can evolve a considerable amount of heat. Control of evolved heat can be an important consideration in an epoxy foam. Because a foamed epoxy is an insulating material, (i.e., having low thermal conductivity), heat unable to escape from the center of a sufficiently large sample may actually char or burn the interior of the foam.

Aside from a resin and curing agent, other constituents used to make an epoxy foam generally include a blowing agent, a surfactant, and a filler or nucleating agent (hereafter referred to as a filler). Because epoxies normally react with the curing agent without evolving volatiles, the addition of a blowing agent is required. The blowing agent may be a chemical agent, that thermally decomposes and evolves gas due to the heat of the exothermic epoxy reaction, or a physical agent, which simply vaporizes at its boiling temperature to liberate gas. Chemical agents include ammonium carbonate, sodium bicarbonate, and sulfonyl hydrazide. Physical agents include liquid solvents such as toluene, fluorocarbons (FCs), chlorofluorocarbons (CFCs), and hydrochlorofluorocarbons (HCFCs).

Surfactants are used in epoxy foams to promote foaming and stabilization of the subsequent cellular structure. A surfactant generally serves to decrease the surface tension of the pre-cure composition and thereby promote increased expansion, smaller cells, and more uniform cell size and texture of the expanded formed product. The surfactants used in polyurethane foam systems, such as silicone-based surfactants, are the same ones generally used in epoxy foams. The cell structure can be greatly affected by the surfactant, which in turn influences the properties of the resultant foam.

Fillers are added to epoxy foam formulations for reasons including lowering cost, adding color, reducing exotherms, and controlling shrinkage rates. Fillers in the form of fine particles (for example, carbon black or fumed silica) may also serve as nucleating agents. Small particles provide sites for heterogeneous nucleation which allow for initiation and subsequent growth of foam cells. In heterogeneous nucleation, gas molecules driven by supersaturation preferentially form nucleation sites on the solid/fluid interfaces of the nucleating agent. The ultimate cell size is determined by other factors including the exotherm, the rate of cure, the amount of blowing agent, and interactions between the epoxy and surfactant.

There are several important parameters that must be considered in the development of a foam with a desirable cellular structure. First, the rheology of the epoxy mixture during the rise of the foam is vitally important. As the epoxy and curing agent cross-link and cure, the liquid becomes more viscous. The viscosity increase is necessary to retain the cell structure created during the rise of the foam. An epoxy that does not become sufficiently viscous to maintain a cellular structure during the rise of the foam will coalesce and collapse. An epoxy that becomes extremely viscous and gels too early may prematurely terminate the foam rise, not allowing for full expansion.

Another important processing parameter closely related to foam rheology is the epoxy cure rate, which is dependent on the processing temperature, as well as the chosen resins or curing agents. A very fast reacting epoxy-curative system with a large exotherm may result in a cure rate, which does not allow sufficient processing time for the foam to rise. Furthermore, an excessive amount of heat from a large exotherm could result in burn out of the interior regions of the foam. Conversely, an extremely slow reacting epoxy may not become viscous and gel within an appropriate amount of time to establish a cellular structure during the foam rise, requiring addition of external heat or a reaction accelerator to increase the cure rate. Other processing parameters which affect epoxy foam quality and cell structure are surface tension and cell nucleation. Surfactant is added at an appropriate level to control the surface tension of the fluid. As already noted, the surfactant can have a significant influence on cell size and foam morphology. The addition of fine particulates such as carbon black or fumed silica can be added to facilitate the nucleation of a great number of small foam pores. Therefore, epoxy foam encapsulants of different cellular structure and therefore different mechanical, thermal and electrical properties, can be formed by tailoring the choice of resins, curing agents and processing conditions.

According to the present invention, the epoxy foam comprises a plurality of resins, a plurality of curing agents, a surfactant, a blowing agent, and a filler. More particularly, the invention comprises two resins of different reactivities, two curing agents that cure at different rates that function to provide a desired foam structure, a surfactant that functions to lower the surface tension of the epoxy mixture and stabilize the foam structure established by the blowing agent, and a filler. Dual resins and dual curing agents of varying reactivities permit the adjustment of the resin ratio, curing agent ratio, or both, to achieve a desired foam pore size, density, or volume. A more reactive formulation utilizing a greater relative amount of the highly reactive resin and/or curing agent could be used in applications where smaller foam cells are desired and foam volume is small. Such a formulation creates a faster curing epoxy system that results in early termination of foam cell growth and expansion. A less reactive formulation employing a lesser relative amount of the highly reactive resin and/or curing agent may be used in applications where larger foam cells are permissible or desired and where foam volume is large. A less reactive formulation creates a slower curing epoxy system that results in late termination of foam cell growth and expansion. Control of pore size and density, combined with control of the particular constituents chosen for the epoxy foam formulation also allow control of mechanical, thermal, and electrical properties of the resulting epoxy foam.

More particularly, preferred in the present invention are the resins EPON 830 (manufactured by Shell Corporation), a diglycidyl ether of bisphenol A resin, which is a high viscosity resin with relatively low reactivity which raises the initial viscosity of the epoxy foam mixture and EPON 8121 (manufactured by Shell Corporation), a bisphenol resin with acrylated phenols, that is highly reactive compared with other commercially available resins and which cures rapidly with epoxy curing agents. Also preferred are the curing agents ANCAMINE 2049 (manufactured by Air Products & Chemical Corporation), a compound consisting essentially of 3-3'-dimethylmethylenedi(cyclohexylamine) and EPI-CURE 3270 (manufactured by Shell Corporation), a compound consisting essentially of n-aminoethyl piperazine, diethylene triamine, and nonyl phenol. ANCAMINE 2049 is a cycloaliphatic amine curing agent which has a long cure time, relative to other commercially available curing agents, with epoxy resins and serves to increase the glass transition temperature of the cured epoxy, thereby increasing mechanical stability at higher temperatures. EPI-CURE 3270 is an aliphatic amine curing agent which is more reactive and cures faster that the ANCAMINE 2049. The preferred blowing agent is FC-72 Electronic Fluid (manufactured by 3M Corporation), a perfluorinated solvent (primarily compounds with 6 carbons), and having a boiling point (56°°C.)

which allows the solvent to boil at a point in the epoxy cure to form bubbles (pores in the material) thereby forming a foam. The preferred surfactant is DC-193 Surfactant (manufactured by Air Product & Chemical Corporation), an ethylene oxide-propylene oxide siloxane block polymer. This surfactant lowers the surface tension of the epoxy mixture sufficiently to allow foam structure to form and stabilize. Common fillers or nucleating agents include a carbon black filler, such as Cabot Monarch 280 carbon black (manufactured by Cabot Corporation), fumed silica or titanium dioxide. This filler serves as a nucleating agent to promote uniform cell structure throughout the epoxy foam sample.

An important part of the present invention is that reactivity and exotherm of the epoxy foam can be controlled by using appropriate proportions of these resins, curing agents, surfactant, blowing agent, and filler. Larger volume foams tend to have higher exotherms (i.e., evolved heat) which accelerate the cure of the epoxy. Exhibiting control of the epoxy reactivity and exotherm would be necessary to foam large volumes. As shown in the Examples, by varying the proportion of these constituents, reactivity can be tailored to achieve the desired foam volume and geometry and thermal, mechanical and electrical properties.

In the process of the present invention, a plurality of resins is physically mixed with a surfactant and filler or nucleating agent, generally at approximately room temperature. A blowing agent is added to the resulting mixture and physically mixed. Preferably the blowing agent is added incrementally because it is a volatile solvent which tends to evaporate until it is mixed into the epoxy resin. A plurality of curing agents is physically mixed with the mixture of resins, surfactant, filler, and blowing agent. The resulting mixture is heated, at a temperature greater than the boiling temperature of the blowing agent and cured for a period of time generally greater than one hour and up to several days to provide the resulting epoxy foam.

In one embodiment, an epoxy foam encapsulant was desired with properties similar to a product, called Ablefoam®, now discontinued by Ablestick Corporation. An epoxy foam encapsulant was desired that had similar mechanical, thermal and electrical properties but that did not use toxic components, particularly methylene dianiline, and could also be tailored to have either a nominal density of approximately 10 lb/ft$^3$ or 20 lb/ft$^3$.

Example 1 describes the composition and process of making of the epoxy foam encapsulant with a nominal density of approximately 20 lb/ft$^3$. Example 2 describes the composition and process of making of the epoxy foam encapsulant with a nominal density of approximately 10 lb/ft$^3$. The constituents used to make the epoxy foams of Example 1 and Example 2 differ primarily in the surfactant and blowing agent. The epoxy foam of Example 2 has a significantly higher proportion of surfactant and blowing agent than Example 1, thus providing a lower viscosity during epoxy foam formation. The epoxy foam of Example 2 is thus tailored to have a lower density (approximately 11 lb/ft$^3$ compared with 22 lb/ft$^3$) and higher nominal cell size than the foam of Example 1 (approximately 400 mm compared with 200 mm in Example 1).

Russick and Rand (Sandia National Laboratories Technical Report SAND98-2538, Albuquerque, N. Mex., December, 1998) describe the results of tests to compare the mechanical, thermal and electrical properties of the epoxy foam encapsulants of the present invention with the corresponding properties of the product for which a replacement was desired. The tests demonstrated that the mechanical properties, specifically the compressive strength and modulus and tensile strength and modulus, were slightly better for the epoxy foam encapsulant of Examples 1 and 2 compared with the discontinued Ablefoam® product. The glass transition temperature and coefficient of thermal expansion for both materials were approximately the same. Also, the dielectric constant and dissipation factors for the materials of Examples 1 and 2 were similar to the discontinued Ablefoam® product. This embodiment demonstrated the capability to tailor specific properties in an epoxy foam encapsulant using multiple resins and curing agents. An important advantage was the capability to choose resins and curing agents that did not contain carcinogenic compounds.

Comparative Example 1 and Example 3 demonstrate the utility of having multiple epoxy resins and curing agents to be able to develop a suitable epoxy foam encapsulant with desired properties. In Comparative Example 1, a small-volume epoxy foam patch was needed to repair an epoxy foam encapsulant on an existing electronics-based system. A formulation was prepared using two epoxy resins but only one curing agent that achieved properties compatible with the existing but now discontinued epoxy foam. However, this formulation proved inadequate when used in large volumes. Experimentation demonstrated that an epoxy foam encapsulant could be foamed suitable for use in large volume applications with the desired properties by using multiple resins as well as multiple curing agents. Example 3 provides the composition and process of making of such an epoxy foam encapsulant.

Examples of practice of the present invention are as follows.

EXAMPLE 1

The following ingredients were used at the specified quantities to make an epoxy foam sample:

Epon 830 epoxy resin (Shell Corporation): 20.11 g

Epon 8121 epoxy resin (Shell Corporation): 13.36 g

Ancamine 2049 curing agent (Air Products & Chemical Corporation): 8.63 g

Epi-cure 3270 curing agent (Shell Corporation): 8.77 g

DC-193 surfactant (Air Products & Chemical Corporation): 1.02 g

FC-72 blowing agent (3M Corporation): 2.09 g

Cabot Monarch 280 carbon black (Cabot Corporation) 0.68 g

The procedure for preparation of the epoxy foam sample was as follows: The Epon 830 resin was weighed out in a mixing container at room temperature. The Epon 8121 resin was weighed out in the mixing container at room temperature. The DC-193 surfactant was weighed out in the mixing container at room temperature. The Monarch 280 carbon black was weighed out in the mixing container at room temperature. The contents of mixing container were mixed thoroughly with a spatula for about 2 minutes. The FC-72 blowing agent was added to contents of the mixing container and stirred together. The FC-72 was added incrementally until the desired weight was achieved (FC-72 is added incrementally since it is a volatile solvent that tends to evaporate until it is mixed into the epoxy resin mixture). The Ancamine 2049 curing agent was weighed out in the mixing container at room temperature. The Epi-cure 3270 curing agent was weighed out in mixing container at room temperature. The contents in the mixing container were mixed thoroughly with a spatula for about 2 minutes. After mixing, 36.3 g of the epoxy formulation were weighed out in a 4" I.D.×½" thick aluminum mold preheated at 65°°C. The mold was sealed and returned to a 65°°C. forced convection oven to cure for 4 hours.

The resulting epoxy foam sample had a density of 0.347 g/cc (22 lb/ft$^3$) and had a nominal cell size of about 200 mm.

EXAMPLE 2

The following ingredients were used at the specified quantities to make an epoxy foam sample:

Epon 830 epoxy resin: 10.03 g
Epon 8121 epoxy resin: 6.67 g
Ancamine 2049 curing agent: 4.33 g
Epi-cure 3270 curing agent: 4.50 g
DC-193 surfactant: 0.84 g
FC-72 blowing agent: 2.50 g
Cabot Monarch 280 carbon black: 0.33 g The Epon 830 resin, Epon 8121 resin, DC-193 surfactant, and Monarch 280 carbon black were weighed out in a mixing container at room temperature. The contents of mixing container were mixed thoroughly with a spatula for about 2 minutes. The FC-72 blowing agent was added to contents of mixing container, and stirred together. The FC-72 was added incrementally until the desired weight was achieved (FC-72 is added incrementally since it is a volatile solvent that tends to evaporate until it is mixed into the epoxy resin mixture). The Ancamine 2049 curing agent was weighed out in the mixing container at room temperature. The Epi-cure 3270 curing agent was weighed out in mixing container at room temperature. All the contents in the mixing container were mixed thoroughly with a spatula for about 2 minutes. After mixing, 18.2 g of the epoxy formulation was weighed out in a 4" I.D.×½" thick aluminum mold preheated at 65°°C. The mold was sealed and returned to a 65°°C. forced convection oven to cure for 4 hours.

The resulting epoxy foam sample had a density of 0.174 g/cc (10.9 lb/ft$^3$) and had a nominal cell size of about 400 mm.

COMPARATIVE EXAMPLE 1

The following ingredients were used at the specified quantities to make an epoxy foam patch to be compatible with an existing epoxy foam formulation, called Ablefoam®, now discontinued by Ablestick Corporation. The epoxy foam patch is not made according to the present invention as only one curing agent is used in this formulation.

Epon 828 epoxy resin: 85% of resin
Epon 8121 epoxy resin: 15% of resin
Epi-cure 3270 curing agent: 21.4 phr
DC-193 surfactant: 1.0 phr
HCFC-141b blowing agent: 5.0 phr (manufactured by Allied Signal Corp.)
Cabosil M-7D: 2.0 phr (manufactured by Cabot Corp.)

The stepwise procedure for preparation of the epoxy foam sample was as follows:

The Epon 828 resin, the Epon 8121 resin, the DC-193 surfactant, and the Cabosil M-7D were weighed out in the mixing container at room temperature. The contents of mixing container were mixed thoroughly with a spatula for about 2 minutes. The HCFC-141b blowing agent was added to contents of mixing container, and stirred together. The blowing agent was added incrementally until the desired weight was achieved. The Epi-cure 3270 curing agent was weighed out in mixing container at room temperature. All the contents in the mixing container were mixed thoroughly with a spatula for about 2 minutes. After mixing the epoxy formulation was used as a patch in an electronic system that had previously been encapsulated with the Ablefoam® foam and for which a patch was required. The system was sealed and returned to a 70°°C. forced convection oven to cure.

The resulting epoxy foam patch had properties consistent with the Ablefoam® foam.

EXAMPLE 3

While the epoxy foam formulation of Comparative Example 1 was sufficient for small-volume patching, the formulation was not suited for more general large volume applications because that formulation had a very short pot life (i.e., processing time prior to cure). Further experimentation revealed that epoxy foam formulations having multiple epoxy resins and multiple curing agents could be tailored to have the desired thermal, mechanical, and electrical properties by varying the proportion of the varying constituents.

The following ingredients were used at the specified quantities to make an epoxy foam sample of cylindrical geometry with a diameter of 3 inches and a length of 8 inches. The standard curative ratio was modified to cause the formulation to be less reactive and allow for sufficient cure time such that the foam could rise sufficiently to fill the larger volume mold:

Epon 830 epoxy resin: 132.9 g (60% of resin)
Epon 8121 epoxy resin: 88.7 g (40% of resin)
Ancamine 2049 curing agent: 65.2 g (29.5 phr)
Epi-cure 3270 curing agent: 38.7 g (17.5 phr)
DC-193 surfactant: 6.8 g (3.0 phr)
FC-72 blowing agent: 13.3 g (6.0 phr)
Cabot Monarch 280 carbon black: 4.4 g (2.0 phr)

The stepwise procedure for preparation of the epoxy foam sample was as follows:

The Epon 830 resin, the Epon 8121 resin, the DC-193 surfactant, and the Monarch 280 carbon black were weighed out in the mixing container at room temperature. The contents of mixing container were mixed thoroughly with a spatula for about 2 minutes. The FC-72 blowing agent was added to contents of mixing container, and stirred together. The FC-72 was added incrementally until the desired weight was achieved (FC-72 is added incrementally since it is a volatile solvent that tends to evaporate until it is mixed into the epoxy resin mixture). The Ancamine 2049 curing agent was weighed out in the mixing container at room temperature. The Epi-cure 3270 curing agent was weighed out in mixing container at room temperature. All the contents in the mixing container were mixed thoroughly with a spatula for about 2 minutes. After mixing, 300 g of the epoxy formulation was weighed out in a 3" I.D.×8" long cylindrical aluminum mold preheated at 65° C. The mold was sealed and returned to a 65° C. forced convection oven to cure for 4 hours.

The resulting epoxy foam sample had a density of 20 lb/ft$^3$ and had a nominal cell size of about 250 mm.

EXAMPLE 4

20 lb/ft$^3$ Density Epoxy Foam Kit

A premixed epoxy foam kit has been developed for an epoxy foam formulation for a foam density of approximately 20 lb/ft$^3$. The kit consists of three components which are blended together to form the epoxy foam mixture. The epoxy foam kit makes weighing and mixing the materials more convenient for the operator because only three components are involved rather than the seven individual starting materials. The kit consists of Component A, which includes two epoxy resins, a surfactant, and a nucleating agent, Component B, which includes a blowing agent, and Component C which includes the two curing agents.

The following is the composition of Components A, B, and C that make up the 20 lb/ft$^3$ density epoxy foam kits:

Component A:
  Epon 830 epoxy resin: 57.1 wt %
  Epon 8121 resin: 38.1 wt %
  DC-193 surfactant: 2.9 wt %
  Monarch 280 carbon black: 1.9 wt %
Component B:
  FC-72 blowing agent: 100 wt %
Component C:
  Ancamine 2049 curing agent: 62.8 wt %
  Epi-cure 3270 curing agent: 37.2 wt %

The following are the final amounts of Components A, B, and C to make an epoxy foam mixture for 20 lb/ft$^3$ foam density:
  Component A: 66.5 wt %
  Component B: 3.8 wt %
  Component C: 29.7 wt %

To prepare the epoxy foam, Component A is weighed out in a mixing container at room temperature. Component B is added to contents of mixing container and stirred. Component B is added incrementally until the desired weight is achieved (FC-72 is added incrementally since it is a volatile solvent that tends to evaporate until it is mixed into the epoxy resin mixture). Component C is weighed out in the mixing container at room temperature. All the contents in the mixing container are mixed thoroughly with a spatula for about 2 minutes. After mixing, the epoxy formulation is weighed out in a mold preheated at 65°°C. The mold is sealed and returned to a 65°°C. forced convection oven to cure for 4 hours.

EXAMPLE 5

10 lb/ft$^3$ Density Epoxy Foam Kit

A premixed epoxy foam kit has been developed for an epoxy foam formulation for a foam density of approximately 10 lb/ft$^3$. The kit consists of three components which are blended together to form the epoxy foam mixture. The epoxy foam kit makes weighing and mixing the materials more convenient for the operator because only three components are involved rather than the seven individual starting materials. The kit consists of Component A, which includes two epoxy resins, a surfactant, and a nucleating agent, Component B, which includes a blowing agent, and Component C which includes the two curing agents.

The following is the composition of Components A, B, and C for the 10 lb/ft$^3$ density epoxy foam kits:

Component A:
  Epon 830 epoxy resin: 56.1 wt %
  Epon 8121 resin: 37.4 wt %
  DC-193 surfactant: 4.7 wt %
  Monarch 280 carbon black: 1.9 wt %
Component B:
  FC-72 blowing agent: 100 wt %
Component C:
  Ancamine 2049 curing agent: 62.8 wt %
  Epi-cure 3270 curing agent: 37.2 wt %

The following are the final amounts of Components A, B, and C that are required for making the epoxy foam mixture for 10 lb/ft$^3$ foam density:
  Component A: 63.3 wt %
  Component B: 8.9 wt %
  Component C: 27.8 wt %

The processing procedure is similar to that described in Example 4 to prepare the 20 lb/ft$^3$ epoxy foam formulation.

The invention has been described in detail above and in the specific examples. Further variations will be apparent to those skilled in the art. The true scope of the invention is to be found in the appended claims.

We claim:

1. An epoxy foam with a density between approximately 10 lb/ft$^3$ and approximately 22 lb/ft$^3$, comprising:
   at least two resins, one resin being more reactive than the other resins, said resins being selected from the group consisting of a diglycidyl ether of bisphenol A and a bisphenol resin with acrylated phenols;
   at least two curing agents, one curing agent curing faster than the other curing agents;
   at least one blowing agent;
   at least one surfactant; and
   optionally at least one filler; wherein the epoxy foam resulting from the mixture of said resins, said curng agents, said blowing agent, said surfactant and optionally said filler has a density between approximately 10 lb/ft$^3$ and approximately 22 lb/ft$^3$.

2. The epoxy foam of claim 1, wherein the at least two resins consists essentially of a diglycidyl ether of bisphenol A and a bisphenol resin with acrylated phenols.

3. The epoxy foam of claim 1, wherein the at least two curing agents are selected from the group consisting of amines, polyphenols, and anhydrides.

4. The epoxy foam of claim 1 wherein the at least two curing agents consists of a cycloaliphatic amine curing agent and a curing agent comprising an n-aminoethyl piperazine, diethylene triamine, and a phenol.

5. The epoxy foam of claim 1 wherein the at least one blowing agent is selected from the group consisting of a physical blowing agent and a chemical blowing agent.

6. The epoxy foam of claim 5 wherein the physical blowing agent is selected from the group consisting of toluene, fluorocarbons, chlorofluorocarbons and hydrochlorofluorocarbons.

7. The epoxy foam of claim 5 wherein the chemical blowing agent is selected from the group consisting of ammonium carbonate, sodium bicarbonate, and sulfonyl hydrazide.

8. The epoxy foam of claim 1 wherein the at least one surfactant is an ethylene oxide-propylene oxide siloxane block polymer.

9. The epoxy foam of claim 1 wherein the at least one filler is selected from the group consisting of carbon black, fumed silica, and titanium dioxide.

10. The epoxy foam of claim 1 wherein the at least one filler is a nucleating agent.

11. The epoxy foam of claim 1 wherein the nominal cell size of the epoxy foam is between approximately 200 mm and approximately 400 mm.

12. A process of making an epoxy foam with a tailored density of between approximately 10 lb/ft$^3$ and approximately 22 lb/ft$^3$, comprising:

admixing at least two resins, one resin being more reactive than the others with a at least two curing agents, one curing agent have a faster cure rate than the others, a surfactant and blowing agent, whereby a foamable mixture is formed;

heating said foamable mixture at a temperature greater than the boiling temperature of the blowing agent whereby said mixture is foamed and cured to form an epoxy foam with a tailored density of between approximately 10 lb/ft$^3$ and approximately 22 lb/ft$^3$.

13. A process according to claim 12 wherein a filler is added to said foamable mixture.

14. A process according to claim 12 wherein said foamable mixture is injected into a mold prior to heating.

15. An epoxy foam with a density of approximately 10 lb/ft$^3$, comprising:

approximately 63.3 wt % of component A, consisting of approximately 56 wt % a diglycidyl ether of bisphenol A, approximately 37 wt % of a bisphenol resin with acrylated phenols, approximately 5 wt % of an ethylene oxide-propylene oxide siloxane block polymer surfactant, and approximately 2 wt % carbon black; approximately 8.9 wt % of component B, consisting of a blowing agent of a perfluorinated solvent with a boiling point of approximately 56 C.; and approximately 27.8 wt % of component C, consisting of approximately 63 wt % of a cycloaliphatic amine curing agent and approximately 37 wt % of a curing agent comprising an n-aminoethyl piperazine, diethylene triamine, and a phenol.

16. An epoxy foam with a density of approximately 20 lb/ft$^3$, comprising:

approximately 66.5 wt % component A, consisting of approximately 57 wt % a diglycidyl ether of bisphenol A, approximately 38 wt % of a bisphenol resin with acrylated phenols, approximately 3 wt % of an ethylene oxide-propylene oxide siloxane block polymer surfactant, and approximately 2 wt % carbon black; approximately 3.8 wt % of component B, consisting of a blowing agent of a perfluorinated solvent with a boiling point of approximately 56 C.; and approximately 29.7 wt % of component C, consisting of approximately 63 wt % of a cycloaliphatic amine curing agent and approximately 37 wt % of a curing agent comprising an n-aminoethyl piperazine, diethylene triamine, and a phenol.

17. A process of making an epoxy foam with a tailored density of approximately 10 lb/ft$^3$ and approximately 22 lb/ft$^3$, comprising:

admixing a diglycidyl ether of bisphenol A, a bisphenol resin with acrylated phenols, an ethylene oxide-propylene oxide siloxane block polymer surfactant, carbon black, a blowing agent comprising a perfluorinated solvent with a boiling point of approximately 56 C., a cycloaliphatic amine curing agent and a curing agent comprising an n-aminoethyl piperazine, diethylene triamine, and a phenol to form a foamable mixture;

heating said foamable mixture at a temperature greater than the boiling temperature of the blowing agent whereby said mixture is foamed and cured to form an epoxy foam with a tailored density of between approximately 10 lb/ft$^3$ and approximately 22 lb/ft$^3$.

* * * * *